United States Patent
Park et al.

(10) Patent No.: US 8,059,384 B2
(45) Date of Patent: Nov. 15, 2011

(54) PRINTED CIRCUIT BOARD REINFORCEMENT STRUCTURE AND INTEGRATED CIRCUIT PACKAGE USING THE SAME

(75) Inventors: Se Ho Park, Suwon-si (KR);
Young-Min Lee, Yongin-si (KR);
Ki-Hyun Kim, Suwon-si (KR);
Seok-Myong Kang, Hwaseong-si (KR)

(73) Assignee: Samsung Electronics Co., Ltd (KR)

( * ) Notice: Subject to any disclaimer, the term of this patent is extended or adjusted under 35 U.S.C. 154(b) by 676 days.

(21) Appl. No.: 12/183,463

(22) Filed: Jul. 31, 2008

(65) Prior Publication Data
US 2009/0032292 A1    Feb. 5, 2009

(30) Foreign Application Priority Data
Jul. 31, 2007   (KR) .................. 10-2007-0077047

(51) Int. Cl.
*H05K 1/03*   (2006.01)
*H05K 1/16*   (2006.01)

(52) U.S. Cl. ...................... 361/255; 174/260

(58) Field of Classification Search .......... 174/255, 174/260, 261; 361/760
See application file for complete search history.

(56) References Cited

U.S. PATENT DOCUMENTS

| | | | | |
|---|---|---|---|---|
| 5,574,309 A | * | 11/1996 | Papapietro et al. | 257/679 |
| 5,822,194 A | * | 10/1998 | Horiba et al. | 361/760 |
| 6,506,626 B1 | * | 1/2003 | Chiu | 438/108 |
| 7,038,142 B2 | * | 5/2006 | Abe | 174/255 |
| 2003/0150641 A1 | * | 8/2003 | Kinayman et al. | 174/255 |
| 2006/0139902 A1 | * | 6/2006 | Happoya | 361/760 |
| 2006/0171130 A1 | * | 8/2006 | Konishi et al. | 361/760 |
| 2007/0044303 A1 | * | 3/2007 | Yamano | 29/830 |
| 2009/0107715 A1 | * | 4/2009 | Sasaoka | 174/260 |

FOREIGN PATENT DOCUMENTS

| | | |
|---|---|---|
| KR | 20020032748 | 5/2002 |
| WO | WO0234856 | 5/2002 |

* cited by examiner

*Primary Examiner* — Gregory Thompson
(74) *Attorney, Agent, or Firm* — The Farrell Law Firm, P.C.

(57) ABSTRACT

A printed circuit board reinforcement structure for a printed circuit board receiving a plurality of surface mounting devices, and an integrated circuit package using the same. The structure includes a hard layer having one or more openings formed at areas corresponding to one or more surface mounting devices with a thickness exceeding a predetermined thickness; and a soft layer bonded to a side of the hard layer so that the soft layer can accommodate the protrusion of the surface mounting devices. The structure prevents defects of a printed circuit board, such as deformation, fracture or the like, while substantially reducing the size of a package by applying a reinforcement structure to a thin printed circuit board, thereby reinforcing the rigidity (mechanical strength) of the thin printed circuit board.

17 Claims, 2 Drawing Sheets

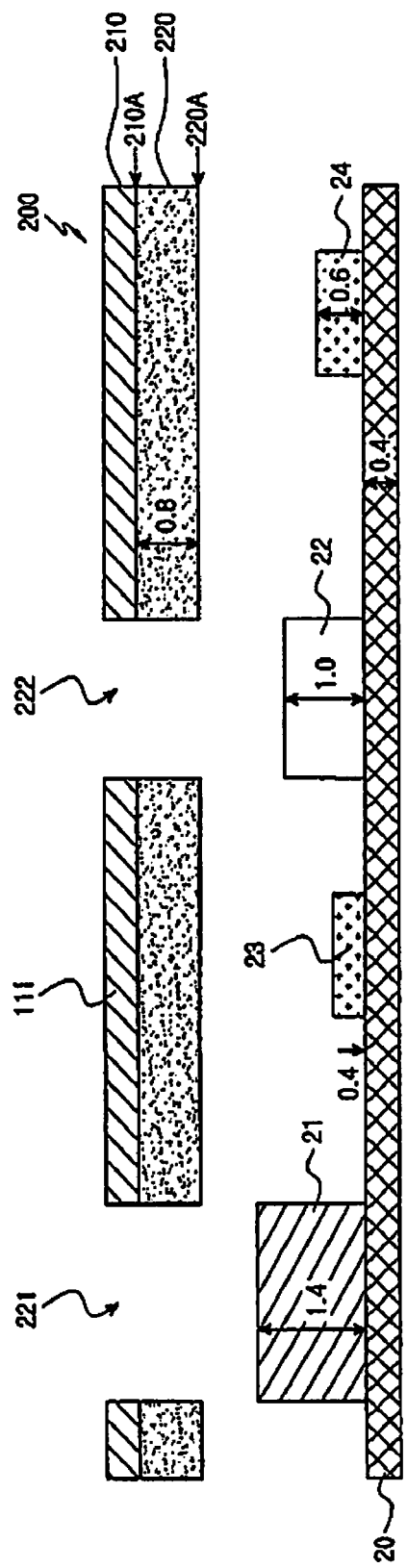
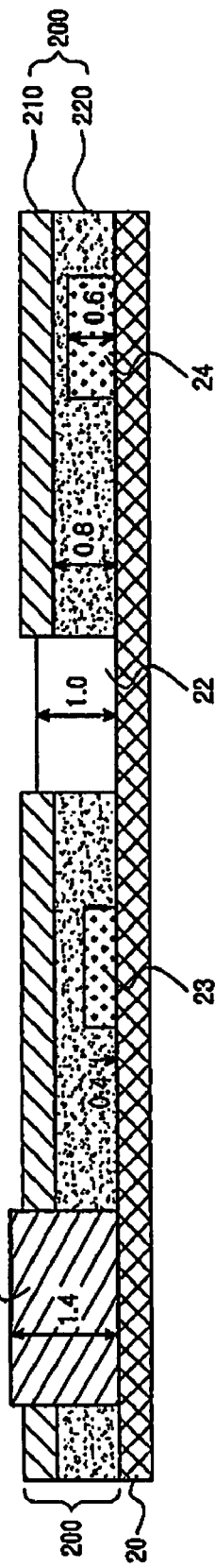
FIG. 2A
FIG. 2B

PRINTED CIRCUIT BOARD REINFORCEMENT STRUCTURE AND INTEGRATED CIRCUIT PACKAGE USING THE SAME

PRIORITY

This application claims the priority under 35 U.S.C. §119(a) to an application filed in the Korean Industrial Property Office on Jul. 31, 2007 and assigned Serial No. 2007-77047, the contents of which are hereby incorporated by reference.

BACKGROUND OF THE INVENTION

1. Field of the Invention

The present invention relates to an IC (Integrated Circuit) package, and in particular to a PCB (Printed Circuit Board) reinforcement structure for preventing the deformation of and damage to a thin printed circuit board (for example, a printed circuit board having a thickness of not more than 0.4 mm), and an integrated circuit package using the same.

2. Description of the Related Art

Recently, due to the miniaturization, thinning, and weight reduction of electronic appliances, highly integrated circuit packages are required. For this reason, the super-thin design of printed circuit boards is also required.

A printed circuit board serves to mechanically fix electronic parts mounted thereon, beyond electrically interconnecting the electronic parts. Therefore, such a printed circuit board should maintain mechanical strength to such an extent that it is not deformed or damaged during a fabrication process of electronic appliances or a packaging process of the printed circuit board.

In general, however, if the thickness of a printed circuit board is reduced, the rigidity (mechanical strength) of the printed circuit board is also reduced, whereby the printed circuit board is subjected to deformation, such as flexure, distortion, etc., and its reliability is deteriorated. Therefore, the practical lower limit for printed circuit board thickness has been limited to about 1.0 mm up to now.

The conventional method for overcoming the limitation in thickness of a printed circuit board is to reinforce a printed circuit board material with filler, such as glass fiber, so as to increase the rigidity of the printed circuit board. However, this conventional method induces a quality problem, such as the deterioration of molding workability, and a difficult recycling problem due to the use of a material harmful for human body and environment.

There is another conventional method for increasing the strength of the printed circuit board by introducing resin between a printed circuit board, on which a SMD (Surface Mounting Device) process is completed, and a mold, and then curing the resin. However, according to this method, the processes for making the mold come into close contact with the printed circuit board, and introducing the resin are very complicated. In addition, since resin residue remains in a gap between the printed circuit board and the mold, a post process for smoothing the surfaces of the printed circuit board is required. Consequently, this method is not suitable for mass production. Specifically, there is a disadvantage in that the resin contracts while it is being cured, thereby rendering the printed circuit board warped.

Another conventional method for increasing the strength of a printed circuit board is to spray resin on a printed circuit board, on which a surface mounting device processing is completed, and then curing the resin. However, the length of time required for spraying the resin is long. In addition, it is necessary to separately block one or more areas, to which the resin shall not be applied. Consequently, this method is also not suitable for mass production.

SUMMARY OF THE INVENTION

Accordingly, the present invention has been made to solve the above-mentioned problems occurring in the prior art, and the present invention provides a printed circuit board reinforcement structure which does not increase the thickness of a printed circuit board, and is capable of maintaining structural rigidity (mechanical strength) of the printed circuit board, without substantially changing the material and design of a printed circuit board, and to provide an integrated circuit package using such a printed circuit board reinforcement structure.

In addition, the present invention provides an integrated circuit package, wherein the method employs a printed circuit board having a thickness of not more than 1.0 mm, so that the thickness of the integrated circuit package can be reduced, and the strength of the printed circuit board can be increased.

According to an aspect of the present invention, there is provided a printed circuit board reinforcement structure for reinforcing the rigidity of a printed circuit board with a plurality of surface mounting devices, including a hard layer having one or more openings formed at areas corresponding to one or more surface mounting devices with a thickness exceeding a predetermined thickness, so that the openings can receive the corresponding surface mounting devices among the surface mounting devices mounted on the printed circuit board, respectively; and a soft layer bonded to a side of the hard layer so that the soft layer can accommodate the protrusion of the surface mounting devices.

The hard layer may include, in combination, one or more materials selected from a group including an EMC (Epoxy Mold Compound); an engineering plastic including PES (Poly Ethylene Sulpone) and PC (Poly Carbonate); a composite material including FRP (Glass Fiber Reinforced Plastic), GRP (Graphite Reinforced Plastic), basalt or ceramic; and a metallic material including steel, stainless steel, aluminum, magnesium and alloys thereof.

Preferably, the flexural strength of the hard layer is not less than 100 MPa at a temperature in the range of −40 to 85° C.

The soft layer may include, in combination, one or more materials selected from a group including rubber with a visco-elastic characteristic; a PSA (Pressure Sensitive Adhesive) or EVA (Ethylene Vinyl Alcohol); hot-melt having a characteristic being softened at a temperature in the range of 60 to 160° C.; and resin or gel having viscosity not less than 1000 cps.

The thickness of the soft layer is greater than or equal to that of the lowest surface mounting device among the surface mounting devices, and the opposite sides of the soft layer have different adhesive forces.

The top and bottom sides of the soft layer have different adhesive forces, and the adhesive force of the top side of the soft layer is greater than that of the bottom side thereof. Preferably, the adhesive force of the bottom side of the soft layer is in the range of 1 to 10 N/cm at a temperature in the range of −40 to 85° C.

The printed circuit board reinforcement structure may further include an adhesive layer formed between the hard layer and the soft layer. The adhesive layer may include, in combination, one or more materials selected from a group including epoxy (BPA); a thermoplastic material including EVA (Ethylene Vinyl Alcohol); and a PAS (Pressure Sensitive Adhesive).

The printed circuit board reinforcement structure may further include a hydrophobic sealing layer formed along the circumferential edge of the soft layer.

According to another aspect of the present invention, there is provided an integrated circuit package including a printed circuit board with a plurality of surface mounting devices; a hard layer having one or more openings formed at areas corresponding to one or more surface mounting devices with a thickness exceeding a predetermined thickness, so that the openings can receive the corresponding surface mounting devices among the surface mounting devices mounted on the printed circuit board, respectively; and a soft layer bonded to a side of the hard layer so that the soft layer can acconmmodate the protrusion of the surface mounting devices.

BRIEF DESCRIPTION OF THE DRAWINGS

The above and other objects, features and advantages of the present invention will be more apparent from the following detailed description taken in conjunction with the accompanying drawings, in which:

FIG. 2A is a schematic cross-sectional exploding view for illustrating an application of the printed circuit board reinforcement structure according to an embodiment of the present invention.

FIG. 2B is a schematic cross-sectional assembled view for illustrating an application of the printed circuit board reinforcement structure according to an embodiment of the present invention.

DETAILED DESCRIPTION OF EXEMPLARY EMBODIMENTS

Figure 1:
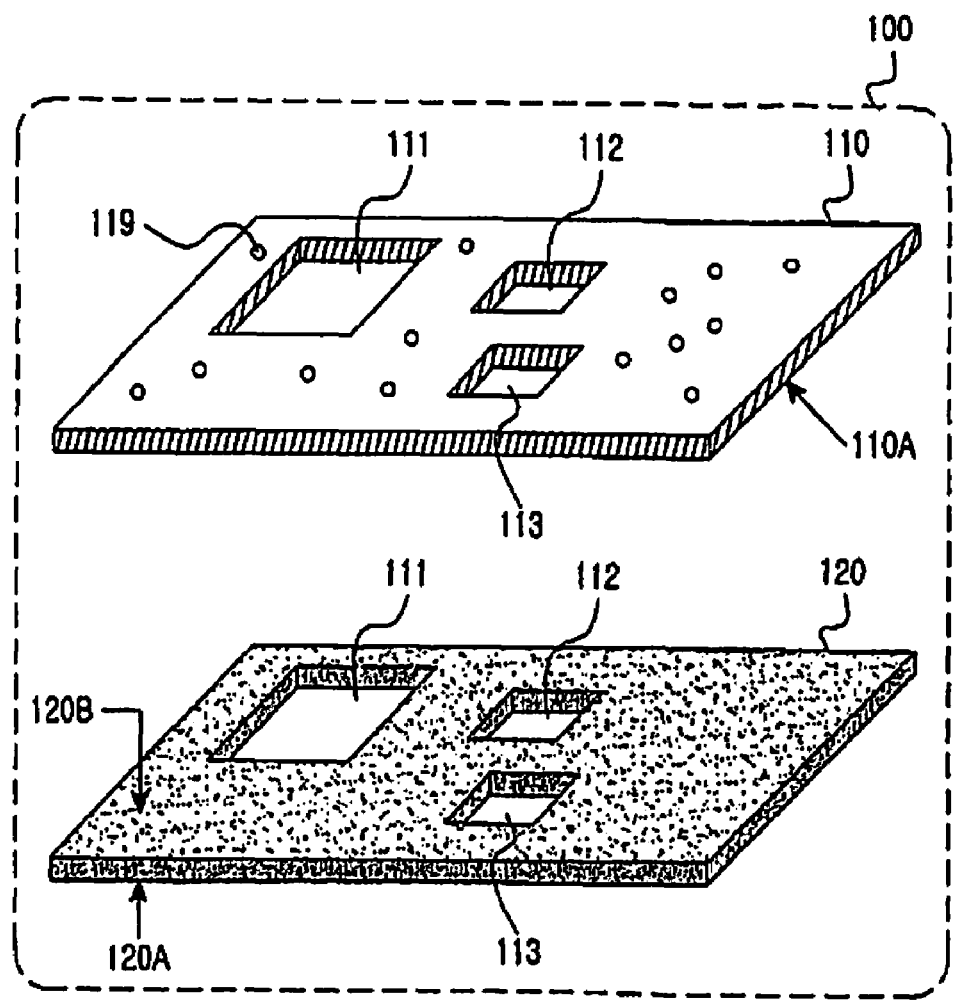
FIG. 1 is a schematic perspective view for illustrating a construction of a printed circuit board reinforcement structure according to an embodiment of the present invention.
Figure 1:
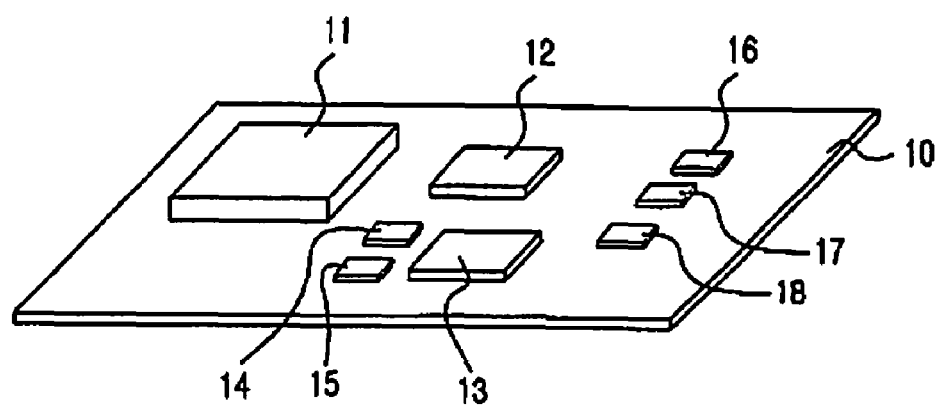

Hereinafter, exemplary embodiments of the present invention will be described with reference to the accompanying drawings. It should be noted that in the following description, the same elements will be designated by the same reference numerals even though they are shown in different drawings. In addition, in the following description of the present invention, a detailed description of known functions and configurations incorporated herein will be omitted for clarity and conciseness.

FIG. 1 is a schematic perspective view for illustrating a construction of a printed circuit board reinforcement structure according to an embodiment of the present invention. For the convenience of description, the printed circuit board reinforcement structure is depicted together with a printed circuit board 10, on which a plurality of SMDs (Surface Mounting Devices) is mounted.

Referring to FIG. 1, the printed circuit board reinforcement structure 100 includes a hard layer 110 and a soft layer 120, wherein the hard layer 110 and the soft layer 120 are adhered to each other on the opposed sides 110A and 120B.

Preferably, the hard layer 110 has a bending modulus preferably of 100 MPa at a temperature in the range of −40 to 85° C., and a volumetric thermal coefficient of not more than 100E-6/K at a temperature in the range of −40 to 85° C., so that the hard layer 110 can maintain structural rigidity with high strength. In addition, the material of the hard layer 110 should be sufficiently thermally stable (higher than 160° C.), thermally conductive, humidity-resistant (absorption rate of not higher than 1%), and weather-resistant.

The examples of materials satisfying the above requirements include engineering plastics, such as EMC (Epoxy Mold Compound), PES (Poly Ethylene Sulpone), PPO (Poly Penylene Oxide), and PC (Poly Carbonate), and metallic materials, such as steel, stainless steel, aluminum, magnesium, and alloy.

Each of the hard layer 110 and the soft layer 120 includes a plurality of openings at areas corresponding to thick surface mounting devices 11, 12 and 13 (the thicknesses of the surface mounting devices may exceed the thickness of the soft layer), so that the surface mounting devices 11, 12 and 13 can be received in the openings, respectively. Preferably, each of the openings 111, 112 and 113 has the same horizontal cross-sectional shape as corresponding one of the surface mounting devices 11, 12 and 13, and has a size larger than that of the corresponding surface mounting device.

In addition, the hard layer 110 is formed with a plurality of holes (for example, pin-holes 119), wherein the holes are spaced from each other so as to dissipate pressure applied to the soft layer when the hard layer 110 and the top surfaces of the surface mounting devices excessively approach each other.

One side 120B of the soft layer 120 is attached to one side 110A of the hard layer 110, wherein the soft layer 120 serves to accommodate the protrusion of a plurality of surface mounting devices mounted on the printed circuit board 10 and having different heights. Specifically, the soft layer 120 preferably accommodates the protrusion of thin surface mounting devices 14, 15, 16, 17 and 18. For this purpose, the soft layer 120 may be formed from rubber and PSA (Pressure Sensitive Adhesive) having a visco-elastic characteristic, or resin or gel having high viscosity. Hot-melt resin having a characteristic softened at a temperature in the range of 100° C. to 160° C. may also be employed for forming the soft layer 120.

Like the material of the hard layer 110, it is preferable that the material of the soft layer 120 should be sufficiently thermally stable (higher than 160° C.), thermally conductive, humidity-resistant (absorption rate of not higher than 1%), and weather-resistant. Preferably, the soft layer 120 has a bending modulus preferably of 100 MPa at a temperature in the range of −40 to 85° C., and a volumetric thermal coefficient of not more than 100E-6/K at a temperature in the range of −40 to 85° C., so that the hard layer 110 can maintain structural rigidity with high strength.

One side (the bottom side 120A) of the soft layer is coated with or film-laminated with adhesive so as to bond the soft layer to the printed circuit board 10 on which the surface mounting devices 11 to 18 are mounted. Preferably, the adhesive maintains its adhesive force in the range of 1 to 10 N/cm at a temperature in the range of −40 to 85° C.

The other side (the top side 120B) is bonded to one side (the bottom side 110A) of the hard layer. In this event, the bonding force between the soft layer and the hard layer is made to be equal to or higher than the bonding force between the soft layer and the printed circuit board, in order to make the residue of the soft layer not retained on the printed circuit board when the reinforcement structure 100 is separated from the printed circuit board. For example, a thermoplastic resin including Epoxy (BPA), and EVA (Ethylene Vinyl Alcohol), or a PSA (Pressure Sensitive Adhesive) may be employed as the adhesive.

In addition, by sealing the circumferential edge of the soft layer with a hydrophobic material, it is possible to prevent moisture from penetrating into the interface between the soft layer and the printed circuit board.

FIGS. 2A and 2B are schematic cross-sectional views for illustrating an application of the printed circuit board reinforcement structure according to an embodiment of the present invention, wherein FIG. 2A shows a state prior to bonding the super-thin printed circuit board 20, on the top of which a plurality of devices (electronic parts) with different heights is mounted, to the reinforcement structure, and FIG. 2B shows a state after to bonding the super-thin printed circuit board 20 to the reinforcement structure 200. The present embodiment shows an example of the application of the present invention, in which the thickness of the super-thin printed circuit board 20 is about 0.4 mm, and the thicknesses (heights) of the devices (electronic parts) mounted on the top of the printed circuit board 20 are 1.4 mm (the device 21), 1.0 mm (the device 22), 0.4 mm (the device 23), and 0.6 mm (the device 24). Now, the fabrication and application processes of the printed circuit board reinforcement structure will be described with reference to the present embodiment.

Referring to FIG. 2A, the hard layer 210 is firstly fabricated with a thickness of about 0.4 mm through extrusion, roll press, or injection molding. If any of the devices mounted on the printed circuit board 20 has a thickness greater than the predetermined thickness (0.8 mm) of the soft layer, areas corresponding to such devices are formed with openings 221 and 222. If the hard layer 210 is fabricated through extrusion or roll press, the openings 221 and 222 can be formed through press or punch trim. If the hard layer 210 is fabricated through injection molding, it is possible to render the openings formed in the injection molding process through the design of a mold for the injection molding.

Next, adhesive is applied to one side (the bottom side 210A) of the hard layer 210 through coating or film-laminating, and then the soft layer 220 with a thickness of 0.8 mm is bonded to the bottom side 210A of the hard layer. The soft layer 220 may be formed through coating or film-laminating with a soft material capable of maintaining a predetermined shape. Theoretically, the thickness of the soft layer 220 should be equal to or greater than the thickness of the thinnest part(s) among the parts mounted on the printed circuit board. Practically, the thickness of the soft layer 220 is preferably not less than 0.3 mm. If the adhesive force between the soft layer 220 and the hard layer 210 is good due to the physical properties thereof, it is possible to omit the process of applying the adhesive. In addition, in order to suppress the penetration of moisture into the interface of the soft layer 220 and the printed circuit board 20 when the reinforcement structure is bonded to the printed circuit board 20, it is possible to seal the circumferential edge of the soft layer 20 with a hydrophobic material.

Next, adhesive is applied to the bottom side 220A of the soft layer through coating or film-laminating, thereby completing the printed circuit board reinforcement structure 200.

Referring to FIG. 2B, the completed printed circuit board reinforcement structure 200 is aligned above the printed circuit board 20, on which the surface mounting devices 21 to 24 are mounted, and then pressed with a proper level of pressure (for example, not higher than 150 MPa), so that the printed circuit board reinforcement structure 200 and the printed circuit board 20 are tightly bonded to each other. At this time, the soft layer 220 is introduced into and fills spaces formed between the devices mounted on the printed circuit board 20. In order to reduce the viscosity of the soft layer and to increase the adhesiveness of the soft layer, it is possible to increase the temperature. However, in order to prevent the damage of the devices, it is preferable if the temperature does not exceed 160° C.

Although specific embodiments are described herein, it is possible to variously modify the embodiments without departing from the scope of the present invention. For example, the materials and the thicknesses of the hard layer and the soft layer, the sizes of the openings, etc. can be properly selected or designed as needed.

According to the present invention, it is possible to prevent the occurrence of defects of a printed circuit board, such as deformation, fracture or the like, while substantially reducing the size of a package by applying a reinforcement structure to a thin printed circuit board having a thickness for example, about 0.4 mm, thereby reinforcing the rigidity (mechanical strength) of the printed circuit board.

In addition, according to the present invention, the entire assembling process is very simplified because it is not necessary to make a mold or a diaphragm to come into close contact with a printed circuit board.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A printed circuit board reinforcement structure for reinforcing rigidity of a printed circuit board receiving a plurality of surface mounting devices, comprising:
    a hard layer and a soft layer, each having at least one opening formed at an area corresponding to at least one thick surface mounting device among the surface mounting devices, the at least one thick surface mounting device having a thickness exceeding a predetermined thickness,
    wherein the soft layer is bonded to a side of the hard layer so that the soft layer can accommodate protrusion of thin surface mounting devices among the surface mounting devices, the thin surface mounting devices being thinner than the predetermined thickness.

2. The printed circuit board reinforcement structure as claimed in claim 1, wherein the hard layer comprises at least one of:
    an EMC (Epoxy Mold Compound);
    an engineering plastic including PES (Poly Ethylene Sulpone) and PC (Poly Carbonate);
    a composite material including FRP (Glass Fiber Reinforced Plastic), GRP (Graphite Reinforced Plastic), Basult or ceramic; and
    a metallic material including steel, stainless steel, aluminum, magnesium and alloys thereof.

3. The printed circuit board reinforcement structure as claimed in claim 1, wherein the flexural strength of the hard layer is not less than 100 MPa at a temperature in the range of −40 to 85° C.

4. The printed circuit board reinforcement structure as claimed in claim 1, wherein the hard layer further comprises a plurality of holes formed through the hard layer.

5. The printed circuit board reinforcement structure as claimed in claim 1, wherein the soft layer comprises at least one of:
    rubber with a visco-elastic characteristic;
    a PSA (Pressure Sensitive Adhesive) or EVA (Ethylene Vinyl Alcohol);
    hot-melt having a characteristic being softened at a temperature in the range of 60 to 160° C.; and
    resin or gel having viscosity of not less than 1000 cps.

6. The printed circuit board reinforcement structure as claimed in claim 1, wherein the thickness of the soft layer is greater than or equal to that of the thinnest surface mounting device among the thin surface mounting devices.

7. The printed circuit board reinforcement structure as claimed in claim 1, wherein top adhesive force of the top side of the soft layer is greater than bottom adhesive force of the bottom side thereof.

8. The printed circuit board reinforcement structure as claimed in claim 7, wherein the bottom adhesive force is in the range of 1 to 10 N/cm at a temperature in a temperature range of −40 to 85° C.

9. The printed circuit board reinforcement structure as claimed in claim 1, further comprising an adhesive layer formed between the hard layer and the soft layer.

10. The printed circuit board reinforcement structure as claimed in claim 9, wherein the adhesive layer comprises at least one of:
   epoxy (BPA);
   a thermoplastic material including EVA (Ethylene Vinyl Alcohol); and
   a PAS (Pressure Sensitive Adhesive).

11. The printed circuit board reinforcement structure as claimed in claim 1, further comprising a hydrophobic sealing layer formed along the circumferential edge of the soft layer.

12. An integrated circuit package comprising:
   a printed circuit board receiving a plurality of surface mounting devices; and
   a hard layer and a soft layer each having at least one opening formed at an area corresponding to at least one thick surface mounting device among the surface mounting devices, the at least one thick surface mounting device having a thickness exceeding a predetermined thickness,
   wherein the soft layer is bonded between the hard layer and the printed circuit board so that the soft layer can accommodate protrusion of thin surface mounting devices among the surface mounting devices, the thin surface mounting devices being thinner than the predetermined thickness.

13. The integrated circuit package as claimed in claim 12, further comprising a plurality of holes formed through the hard layer.

14. The integrated circuit package as claimed in claim 12, wherein the thickness of the soft layer is greater than or equal to that of the thinnest surface mounting device among the thin surface mounting devices.

15. The integrated circuit package as claimed in claim 12, wherein top adhesive force between the soft layer and the hard layer is greater than bottom adhesive force between the soft layer and the printed circuit board.

16. The integrated circuit package as claimed in claim 12, further comprising an adhesive layer formed between the hard layer and the soft layer.

17. The integrated circuit package as claimed in claim 12, further comprising a hydrophobic sealing layer formed along the circumferential edge of the soft layer.

* * * * *